United States Patent
Kessler

(10) Patent No.: US 8,604,356 B1
(45) Date of Patent: Dec. 10, 2013

(54) ELECTRONIC ASSEMBLY HAVING INCREASED STANDOFF HEIGHT

(75) Inventor: Victor Carl Kessler, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 469 days.

(21) Appl. No.: 12/945,464

(22) Filed: Nov. 12, 2010

(51) Int. Cl.
*H05K 1/16* (2006.01)

(52) U.S. Cl.
USPC .......................................... 174/260; 361/804

(58) Field of Classification Search
USPC ................... 174/260; 361/770, 804
See application file for complete search history.

(56) References Cited

U.S. PATENT DOCUMENTS

| | | | |
|---|---|---|---|
| 5,936,846 A * | 8/1999 | Jairazbhoy et al. | 361/770 |
| 6,300,578 B1 * | 10/2001 | Hoffmeyer et al. | 174/263 |
| 2006/0284316 A1 | 12/2006 | Kim | |
| 2008/0179740 A1 | 7/2008 | Liao | |
| 2009/0160049 A1 | 6/2009 | Shinkai et al. | |
| 2009/0294962 A1 | 12/2009 | Hsu | |

* cited by examiner

*Primary Examiner* — Jeremy Norris
(74) *Attorney, Agent, or Firm* — McAndrews, Held & Malloy

(57) ABSTRACT

Various embodiments of an electronic assembly with increased standoff height are provided. In one exemplary embodiment, a substrate is provided. A metallic interconnection land is disposed over the substrate. A solder resist material is applied on a predefined portion of the metallic interconnection land. A metallic solder material is disposed over at least a portion of the solder resist material and contacts a surface of the metallic interconnection land. An air pocket is formed within the metallic solder material over at least a portion of solder resist material. The air pocket acts as a lifting mechanism to increase a standoff height between the substrate and a surface mount component.

23 Claims, 5 Drawing Sheets

US 8,604,356 B1

ELECTRONIC ASSEMBLY HAVING INCREASED STANDOFF HEIGHT

FIELD OF THE INVENTION

The present invention relates in general to electrical integrated circuit devices, and more particularly to embodiments of an electronic assembly having increased standoff height between interconnected components.

DESCRIPTION OF THE RELATED ART

Integrated circuit devices are formed on semiconductor substrates, or wafers. The wafers are then sawed into microelectronic dies, or semiconductor chips, with each die carrying a respective integrated circuit. Each semiconductor chip is mounted to a package, or carrier, substrate, which is then mounted to a circuit board, or motherboard, before being installed in an electronic system. In some cases, various integrated circuit components and devices are stacked, for example in package devices, to reduce footprint or for other related advantages.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION

In one example of a stacked arrangement of integrated circuit components, a surface mount electronic component is disposed over a substrate, such as a printed circuit board (PCB). The surface mount component is typically in communication with the printed circuit board by virtue of a number of electrical interconnection balls that are formed between the two components and generally fabricated of a metallic solder material. In a subsequent fabrication step, an epoxy mold underfill material may be flowed between the PCB and the surface mount component to permanently adhere the two components and provide structural support.

Figure 1:
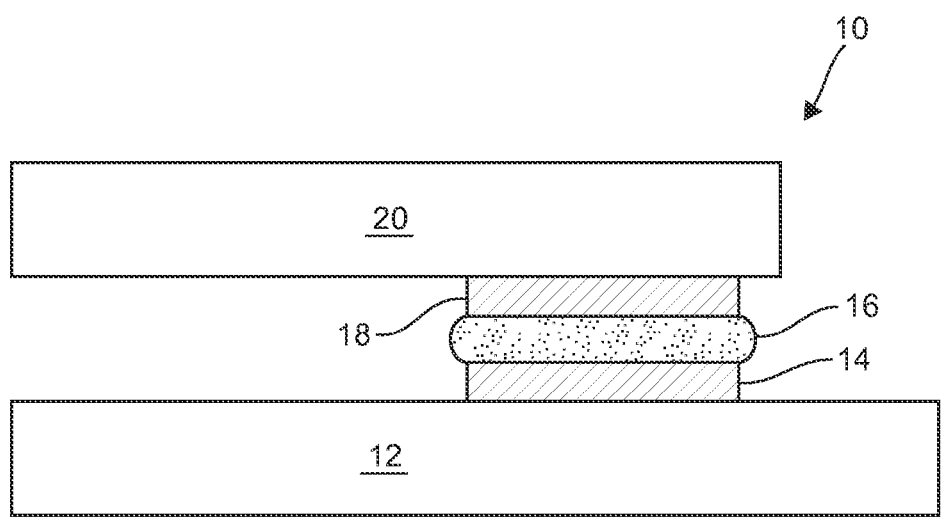
FIG. 1 is a cross-sectional side view illustration of an interconnected substrate and surface mount component known in the prior art.

FIG. 1 is a cross-sectional side view illustration of an electronic assembly 10 having an interconnected substrate 12 and surface mount component 20 known in the prior art. Metal interconnection lands 14, 18 are connected to opposing surfaces of the substrate 12 and surface mount component 20, respectively. A metallic solder material 16 is disposed between metal interconnection lands 14, 18 as shown to provide electrical communication between the substrate 12 and the surface mount component 20.

In view of FIG. 1, during a subsequent mold underfill process, it is desirable that enough standoff height exists between the surface mount component 20 and the substrate 12 to allow for proper mold underfill flow and thereby provide sufficient structural support between the two components 12, 20. Typically, the standoff height seen in configurations such as that depicted in FIG. 1 is approximately 50 microns, and provides minimal adequacy. If the standoff height is not adequate, however, mold underfill flow may be impeded, and the reliability of the components 12, 20 may be reduced. In view of the foregoing, a need exists for a mechanism for electrical components, such as the aforementioned configuration shown in FIG. 1, to provide increased standoff height, and correspondingly, facilitate increased mold underfill flow between interconnected components.

Accordingly, various embodiments of electronic assemblies having increased standoff height between respective interconnected components are provided. In one exemplary embodiment, by way of example only, a substrate is provided. A metallic interconnection land is disposed over the substrate. A solder resist material (or "solder mask") is applied on a predefined portion of the metallic interconnection land. A metallic solder material is disposed over at least a portion of the solder resist material and contacts a surface of the metallic interconnection land. An air pocket is formed within the metallic solder material over at least a portion of solder resist material. The air pocket acts as a lifting mechanism to increase a standoff height between the substrate and a surface mount component. Various other embodiments are also disclosed and provide related advantages.

Figure 2:
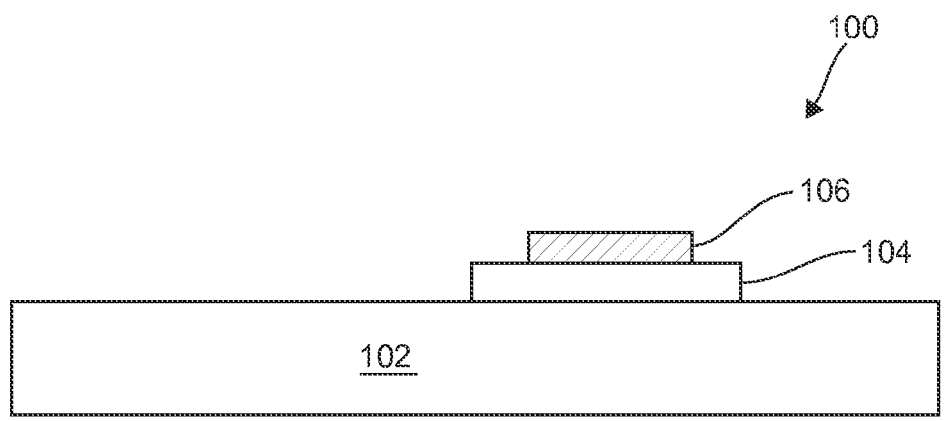
FIG. 2 is a cross-sectional side view illustration of an exemplary embodiment in which various aspects of the claimed subject matter may be implemented, including a substrate, a metal interconnection land disposed over the substrate, and a solder resist material disposed over at least a portion of the substrate.

Turning now to FIG. 2, a cross-sectional side view illustration of an exemplary embodiment of a portion 100 of an electronic assembly in which various aspects of the claimed subject matter may be implemented is shown. Portion 100 illustrates an exemplary step in the fabrication process of an electronic assembly, as will be seen later in more completed examples. In the depicted step, portion 100 includes a substrate 102, which was previously provided. A metal interconnection land 104 is disposed over the substrate. A solder resist material 106 is disposed over at least a portion of the metal interconnection land 104 as shown. The solder resist material 106, in one embodiment, is screened on to the portion of the land 104 using a solder mask stencil containing apertures through which the solder resist material 106 is deposited. The solder resist material 106 may be deposited in alternative ways such as by spin coating or a lamination method, or by other mechanisms known to one of ordinary skill in the art.

As will be further illustrated, the solder resist material 106 may be disposed in an approximately circular pattern over an approximately central location on the metal interconnection land 104 to minimize cracking and ensure the solder resist 106 is encapsulated by solder during a subsequent reflow process. As one of ordinary skill in the art will appreciate, various dimensions such as a thickness, size, surface area, and other physical characteristics of the solder resist material 106 may vary according to a particular implementation. The solder resist material 106 may, in one embodiment, be disposed directly over the substrate. In one exemplary embodiment, the solder resist material 106 may vary in thickness between approximately 5 and 30 microns, depending on a particular application and taking tolerances known to one of ordinary skill in the art into account. In other exemplary embodiments, the solder resist material may exceed 30 microns in thickness, or not exceed 5 microns. Other variations will be apparent to one of ordinary skill in the art.

Figure 3:
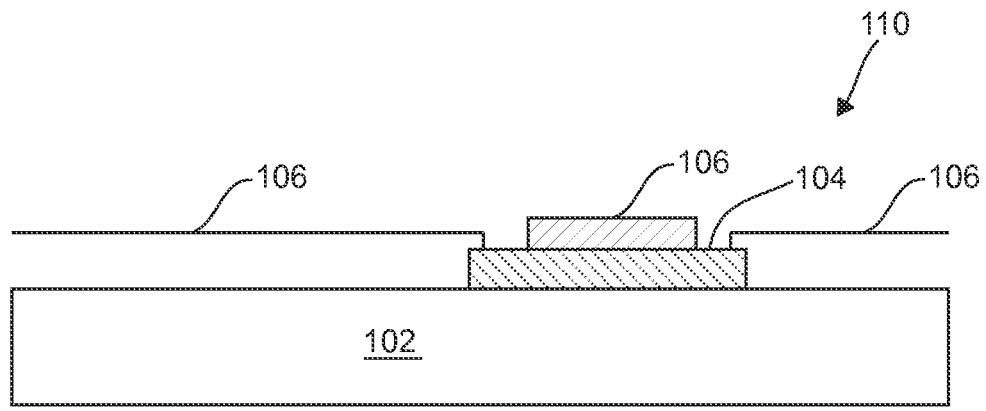
FIG. 3 is a cross-sectional side view illustration of an additional exemplary embodiment, including solder mask material in contact with and disposed over portions of a metal interconnection land.
Figure 4:
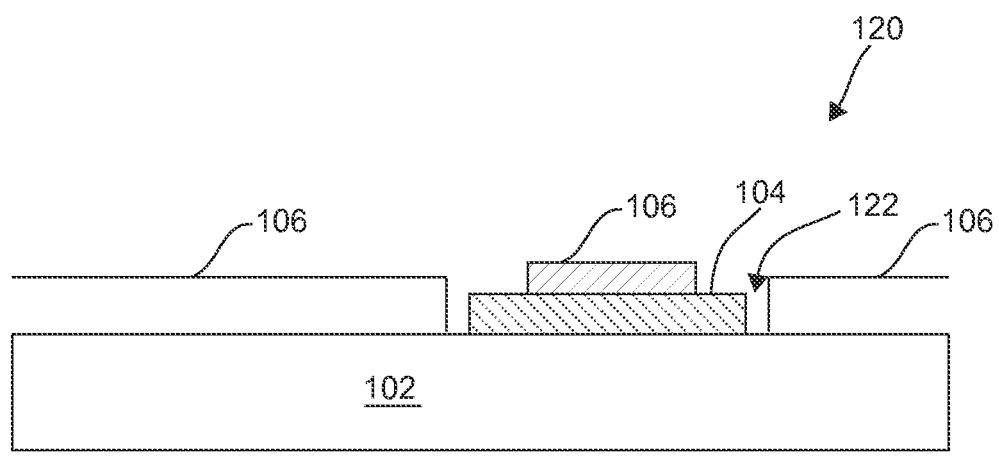
FIG. 4 is a cross-sectional side view illustration of an additional exemplary embodiment, including solder mask material disposed over a substrate and a portion of a metal interconnection land.

Turning to FIGS. 3 and 4, various implementations of depositions of the solder resist material 106 are shown in two exemplary embodiments of electronic assemblies 110 and 120 in a cross-sectional side view illustration. First, in FIG. 3, an exemplary Solder Mask Defined (SMD) design of an electronic assembly 110 shows a deposition of the solder resist material 106 over the substrate 102 in which various edge surfaces of the metal interconnection land 104 are contacted. Here again, a deposition of the solder resist material 106 is made over the metal interconnection land 104, as depicted in FIG. 2, previously. The overlap of the solder resist material 106 over the metal interconnection land 104, as one of ordinary skill in the art will appreciate, provides additional strength to the adhesion bond between the metal interconnection land 104 and the substrate 102.

In contrast to FIG. 3, an exemplary Non-Solder Mask Defined (NSMD) design of an electronic assembly 120 as illustrated in FIG. 4, following, shows a deposition of the solder resist material 106 over the substrate 102 in which gaps 122 are left between the various edge surfaces of the metal interconnection land 104. Again, the solder resist material 106 is also disposed over the metal interconnection land 104 as shown. Aspects of the illustrative embodiments are operative in both SMD and NMSD implementations. Various characteristics of a completed electrical assembly, such as a fine ball pitch between interconnected components, may lend to selection of a SMD design over a NMSD design, and vice-versa, as one of ordinary skill the art will appreciate. An advantage of the illustrated embodiments, accordingly, is an ability to be implemented in a variety of design applications.

Figure 5:
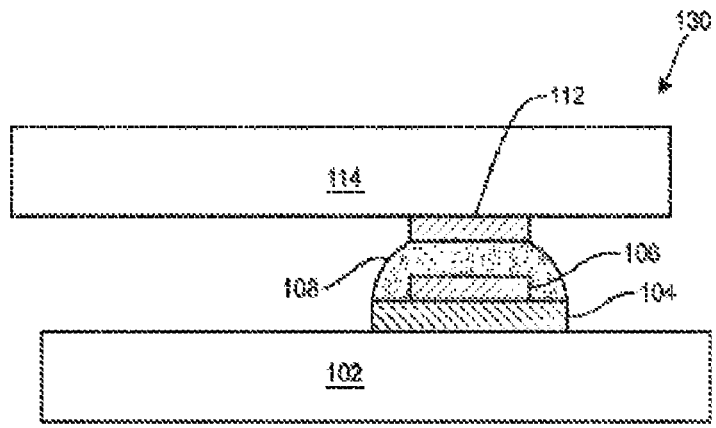
FIG. 5 is a cross-sectional side view illustration of a portion of an exemplary embodiment of an electronic assembly in which aspects of the claimed subject matter may be implemented, including a surface mount component and metal interconnection land disposed over the structures previously depicted in FIG. 2, and a metallic solder material disposed therebetween.

FIG. 5, following, illustrates a portion 130 of an exemplary embodiment of an electronic assembly, again as shown in a cross-sectional side view following a further fabrication step than those shown in FIGS. 2-4, previously, including a solder reflow process and removal of exposed solder resist material. Electronic assembly portion 130 again includes a substrate 102. Metal interconnection lands 104 and 112 are disposed on opposing surfaces of the substrate 102 and surface mount component 114, respectively. Surface mount component 114 is disposed over the metal interconnection land 112 as shown. Surface mount component 114 may include a variety of surface mount parts, such as active, passive and electromechanical components known to one of ordinary skill in the art. A solder resist material 106 is disposed approximately centrally over a portion of the metal interconnection land 104.

A metallic solder material 108 provides electrical connectivity between lands 104 and 112 following the reflow process. In one exemplary embodiment, the metallic solder material 108 may include a lead-free solder material, such as a Sn—Ag (Tin-Silver), a Sn—Cu (Tin-Copper), and Sn—Ag—Cu (Tin-Silver-Copper) solder material 108. In an additional exemplary embodiment, the metallic solder material 108 may include a leaded solder material, such as Sn—Pb (Tin-Lead) solder material 108. As one of ordinary skill in the art will appreciate, the various solders may be selected depending on a variety of factors, such by physical characteristics, or in the interest of minimizing environmental impact or regulatory compliance.

Following the solder reflow and solder resist removal processes, an underfill material may be flowed between the substrate 102 and the surface mount component 114 to provide structural support and enhance reliability of the various electronic components. In one embodiment, the underfill material may include a polyimide (Pi) material or a thermoplastic resin material. The various physical characteristics of the underfill layer may be varied to suit a particular application, which may correspond to such factors as die size, gap height, bump density and fillet size. One of ordinary skill in the art will appreciate the various physical and other characteristics of the underfill material that may be adjusted to suit a particular implementation.

Figure 6:
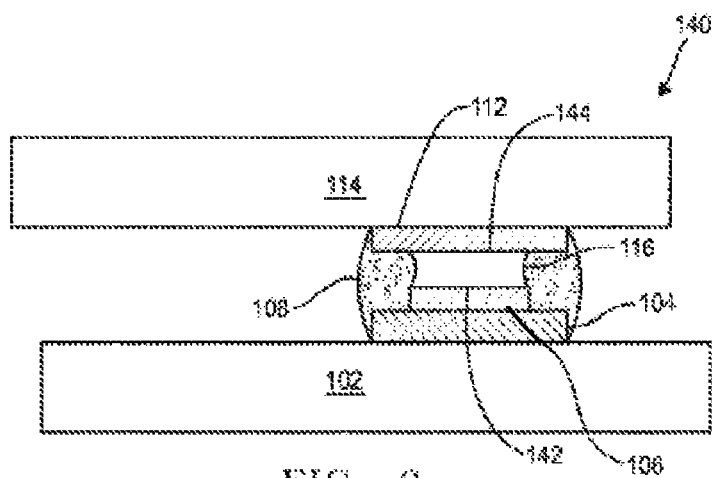
FIG. 6 is a cross-sectional side view illustration of a portion of an additional exemplary embodiment of an electronic assembly, including an air pocket formed over the solder resist material.

Portion 140 in FIG. 6, following, illustrates an additional exemplary embodiment of an electronic assembly, again seen in a cross-sectional side view following the solder reflow process and subsequent removal of exposed solder resist material previously described. In the depicted embodiment, portion 140 again includes substrate 102, metal interconnection lands 104 and 112, surface mount component 114, solder resist material 106, and metallic solder material 108 disposed between the metal interconnection lands 104 and 112.

During the solder reflow process that deposited the solder material 108, the solder material 108 does not wet to the solder resist material 106. Instead, a small void, or air pocket 116 forms over the solder resist material 106 as shown, which acts as a lifting mechanism to the surface mount component 114, providing upward displacement. The air pocket 116 contacts a surface 142 of the solder resist material 106, and an opposing surface 144 of the metal interconnection land 112 as shown. Accordingly, the standoff height of the surface mount component 114 over the substrate 102 is increased, as is the overall volume between the two components 102 and 114. It is preferable for the solder resist material 106 to remain fully encapsulated within the metallic solder material 108.

The solder reflow process used may, as one of ordinary skill in the art will appreciate, vary according to a particular application. In one exemplary embodiment, the electronic assembly (including portion 140 as shown in FIG. 6) is conveyed into a reflow soldering oven. The electronic assembly enters a pre-heat zone, where the temperature of the associated electronic components are gradually, uniformly raised. The components then enter a zone where the temperature is high enough to melt the solder particles in the metallic solder material 108. In one embodiment, the solder is heated gradually, where above approximately 250 C the metallic solder material 108 begins to melt. The molten metallic solder material 108 reaches a peak temperature (e.g., approximately 260 C in on exemplary embodiment), which is held for a predetermined period of time. During this process, the surface mount component 114 is bonded, through the metal interconnection land 112, to the substrate 102 (through the metal interconnection land 104).

In one embodiment, during the heating process, surface tension of the molten metallic solder material 108 retains the surface mount component 114 in place, and automatically aligns the components over the interconnection metal lands 104, 112. A variety of techniques may be implemented for reflowing the metallic solder material 108, as one of ordinary skill in the art will appreciate, such as an infrared reflow (i.e., by use of infrared lamps), a gas convection reflow, and a vapor phase reflow method, in which fluorocarbon liquids having high boiling points are implemented. Other methods may be implemented to suit a particular application, again as one of ordinary skill in the art will appreciate.

Following the reflow process, the electronic assembly (again, including portions 130, 140 as previously shown in FIGS. 5 and 6) may be washed to remove any flux residues and stray solder balls that could short out closely spaced component leads. In one embodiment, rosin flux may be removed with fluorocarbon solvents, high flash point hydrocarbon solvents, or low flash solvents. Water-soluble fluxes may be removed with deionized water and detergent, followed by an air blast to remove residual water. In many embodiments, however, the flux residues may remain on the portions 130, 140 in a "no clean" process, which again may be implemented in the interest of reducing environmental impact.

The increase in standoff height provided by embodiments such as portion 140 in FIG. 6 are unique in that additional volume is created between interconnected electrical components without incurring additional fabrication costs associated with more conventional technologies such as solder-on-pad or copper-pillar technologies. The additional standoff height correlates to improved reliability of the electronic components, as well as increased yield. The additional standoff height may assist in improved heat dissipation. In one exemplary embodiment, approximately 17-27 microns of additional standoff height is obtained through exemplary process aspects of the illustrated embodiments.

Figure 7:
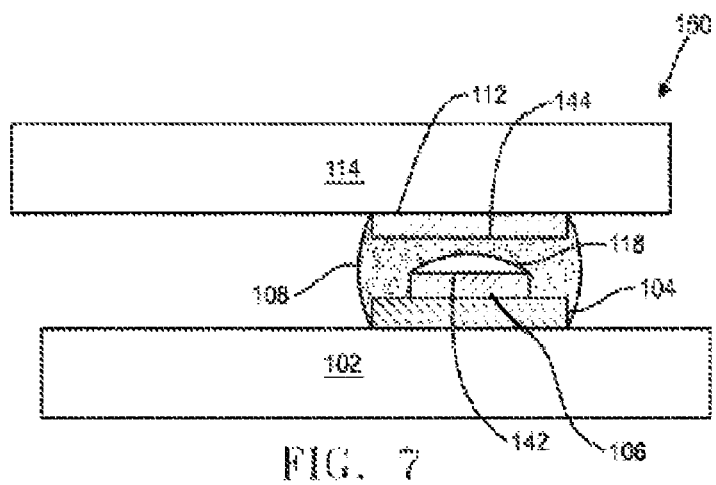
FIG. 7 is a cross-sectional side view illustration of a portion of an additional exemplary embodiment of an electronic assembly, including an additional embodiment of an air pocket formed over the solder resist material.

FIG. 7 is a cross-sectional side view illustration of a portion 150 of an additional exemplary embodiment of an electronic assembly, including an additional embodiment of an air pocket 118 formed over the solder resist material 106. As previously seen in the portion 140 previously depicted in FIG. 6, the substrate 102, surface mount component 114, opposing metal interconnection lands 104 and 112, and solder resist material 106 are again shown. Here, however, after the solder reflow process, the air pocket 118 created in the metallic solder material 108 contacts surface 142 of the solder resist material 106, but does not contact the opposing surface 144 of the metal interconnection land 112. Instead, in the depicted embodiment, a thin layer of solder material 108 remains between the air pocket 118 and the opposing surface 144 as shown.

Figure 8:
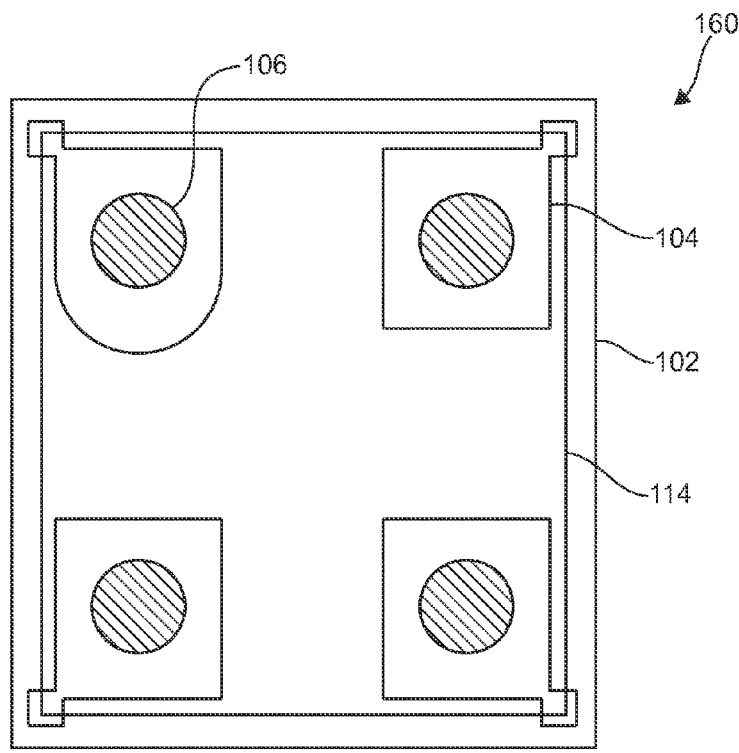
FIG. 8 is a top view of an additional exemplary embodiment of an electronic assembly.
Figure 9:
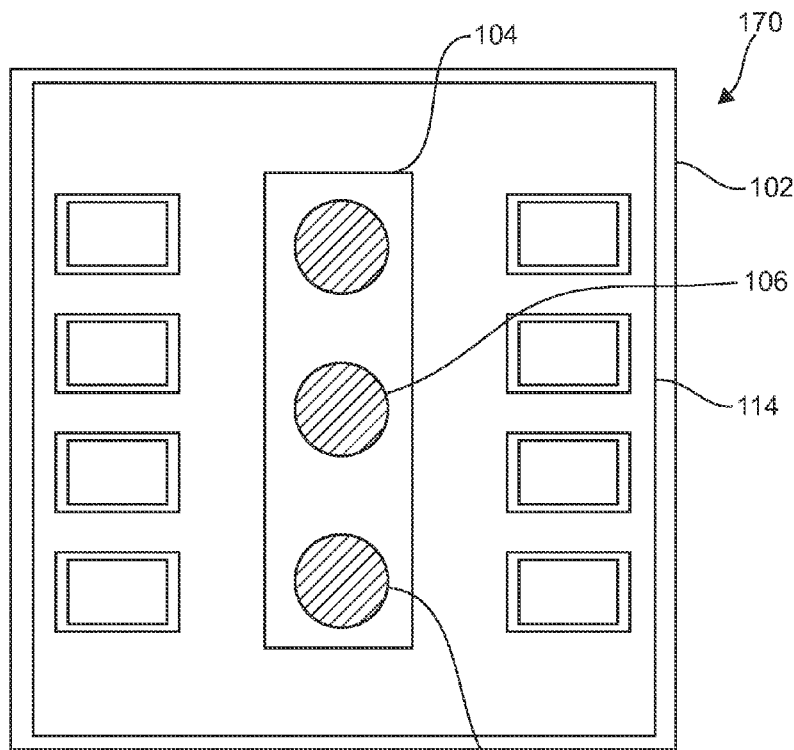
FIG. 9 is a top view of an additional exemplary embodiment of an electronic assembly.

Turning now to FIGS. 8 and 9, following, additional embodiments of electronic assemblies 160 and 170 are shown, respectively, in top view. Here, several metal interconnection lands 104 are shown disposed over substrates 102, and vary in shape and application as one of ordinary skill in the art will appreciate. In FIG. 8, four circular areas of solder resist material 106 are disposed approximately centrally over the metal interconnection lands 104. In FIG. 9, three circular areas of solder resist material 106 are disposed approximately centrally over the metal interconnection lands 104. In both FIGS. 8 and 9, surface mount component 114 is disposed over the solder resist material 106. For purposes of illustrative convenience, the air pockets 116, 118 (FIGS. 6, 7), and metal interconnection lands 112 are not illustrated.

Figure 10:
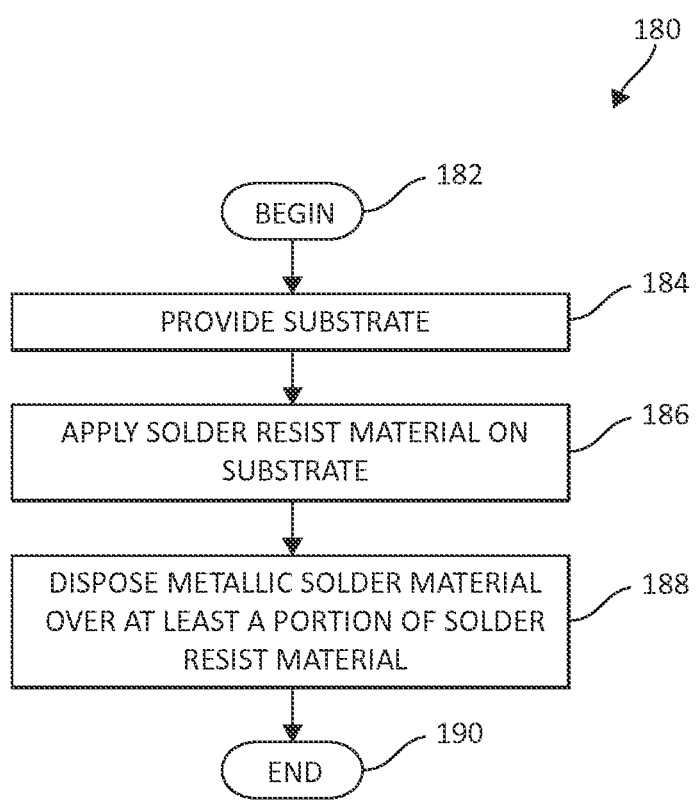
FIG. 10 is a flow chart diagram of an exemplary method of manufacture of an electronic assembly.

FIG. 10, following, illustrates an exemplary method of manufacture 180 of an electronic assembly in which standoff height between interconnected components is increased. Method 180 begins (step 182) by providing a substrate (step 184). As described previously, the substrate may be a PCB or another material in which electrical connectivity is made. In a following step, a solder resist material is applied on the substrate (step 186). The solder resist material may be applied in a variety of configurations, shapes, dimensions, thicknesses, etc. according to a particular application. As was mentioned previously, in one exemplary embodiment, the solder resist material may be approximately centrally disposed over metal interconnection lands to reduce cracking. In a following step, metallic solder material is disposed over at least a portion of the solder resist material (step 188).

The metallic solder material may be deposited over the solder resist material in such a manner so that no air pocket is formed (e.g., FIG. 5), an air pocket touching opposing surfaces of the solder resist material and the surface mount component/metal interconnection land is formed (e.g., FIG. 6), and an air pocket with solder material disposed between a top surface of the air pocket and an opposing surface of the surface mount component/metal interconnection land is formed (e.g., FIG. 7). The portion of the metallic solder material disposed over and/or around the portion of the solder resist material (in conjunction with the air pocket which may be formed) collectively act as a lifting mechanism to improve standoff height of the surface mount component over the substrate, against as previously described. The method 180 then ends (step 182).

While one or more embodiments of the present invention have been illustrated in detail, the skilled artisan will appreciate that modifications and adaptations to those embodiments may be made without departing from the scope of the present invention as set forth in the following claims.

What is claimed is:

1. An electronic assembly, comprising:
a substrate;
a metallic interconnection land disposed over the substrate;
a solder resist material applied on the metallic interconnection land;
a metallic solder material disposed over at least a portion of the solder resist material; and
a surface mount component disposed over the substrate, wherein an air pocket is formed within the metallic solder material over at least a portion of the solder resist material, the air pocket increasing a standoff height between the surface mount component and the substrate, and wherein the air pocket is formed such that a portion of the air pocket contacts the surface mount component.

2. The electronic assembly of claim 1, wherein the metallic solder material is disposed over the at least the portion of the solder resist material such that surfaces of the metallic interconnection land and the surface mount component are contacted by the metallic solder material.

3. The electronic assembly of claim 1, wherein the solder resist material is applied over a predefined portion of the metallic interconnection land.

4. The electronic assembly of claim 1, wherein the metallic solder material is disposed over the at least the portion of the solder resist material such that the solder resist material is encapsulated by the metallic solder material.

5. The electronic assembly of claim 1, wherein the predefined portion is approximately centered on the metallic interconnection land.

6. The electronic assembly of claim 1, wherein the substrate is a printed circuit board (PCB).

7. The electronic assembly of claim 1, wherein the metallic solder material comprises a lead-free solder material.

8. The electronic assembly of claim 7, wherein the lead-free solder material comprises one or more of: tin-silver, tin-copper, and tin-silver-copper.

9. The electronic assembly of claim 1, wherein the metallic solder material comprises a leaded solder material.

10. The electronic assembly of claim 1, wherein an underfill material is located between the substrate and the surface mount component.

11. The electronic assembly of claim 1, wherein the solder resist material is fully encapsulated within the metallic solder material.

12. The electronic assembly of claim 1, wherein the air pocket acts as a lifting mechanism for the increasing.

13. An electronic assembly, comprising:
   a substrate;
   a metallic interconnection land disposed over the substrate, the metallic interconnection land having a surface;
   a solder resist material applied on a predefined portion of the metallic interconnection land; and
   a metallic solder material disposed over at least a portion of the solder resist material and contacting the surface of the metallic interconnection land, wherein an air pocket is formed within the metallic solder material over at least a portion of solder resist material, the air pocket increasing a standoff height of a surface mount component from the substrate, and wherein the air pocket contacts the surface mount component.

14. The electronic assembly of claim 13, further including the surface mount component, wherein the metallic solder material is disposed over the at least the portion of the solder resist material to come into contact with the surface mount component.

15. The electronic assembly of claim 13, wherein the air pocket is completely encapsulated by the metallic solder material and the surface mount component.

16. The electronic assembly of claim 13, wherein the predefined portion is approximately centered on the metallic interconnection land.

17. The electronic assembly of claim 13, wherein the substrate is a printed circuit board (PCB).

18. The electronic assembly of claim 17, wherein the lead-free solder material comprises one or more of: tin-silver, tin-copper, and tin-silver-copper.

19. The electronic assembly of claim 13, wherein the metallic solder material comprises a lead-free solder material.

20. The electronic assembly of claim 13, wherein the metallic solder material comprises a leaded solder material.

21. The electronic assembly of claim 13, wherein an underfill material is located between the substrate and the surface mount component.

22. The electronic assembly of claim 13, wherein the solder resist material is fully encapsulated within the metallic solder material.

23. The electronic assembly of claim 13, wherein the air pocket acts as a lifting mechanism for the increasing.

* * * * *